United States Patent [19]

Inuyama et al.

[11] Patent Number: 4,890,288
[45] Date of Patent: Dec. 26, 1989

[54] LIGHT QUANTITY CONTROL DEVICE

[75] Inventors: Toshihiko Inuyama, Fujisawa; Junichi Kimizuka, Yokohama; Akihisa Kusano, Kawasaki; Kaoru Sato, Yokohama; Takashi Soya, Kawasaki, all of Japan

[73] Assignee: Canon Kabushiki Kaisha, Tokyo, Japan

[21] Appl. No.: 87,707

[22] Filed: Aug. 21, 1987

[30] Foreign Application Priority Data

Aug. 27, 1986 [JP] Japan .................... 61-198988
Aug. 27, 1986 [JP] Japan .................... 61-198989
Aug. 27, 1986 [JP] Japan .................... 61-198990
Aug. 27, 1986 [JP] Japan .................... 61-198991

[51] Int. Cl.$^4$ .................................................. H01S 3/13
[52] U.S. Cl. ........................................ 372/31; 372/29; 372/38
[58] Field of Search ............................ 372/29, 31, 38

[56] References Cited

U.S. PATENT DOCUMENTS

| | | | |
|---|---|---|---|
| 4,201,994 | 5/1980 | Hoshito et al. | 346/108 |
| 4,268,843 | 5/1981 | Brown et al. | 357/19 |
| 4,292,606 | 9/1981 | Trimmel | 332/7.510 |
| 4,347,610 | 8/1982 | Meuleman | 372/29 |
| 4,369,525 | 1/1983 | Breton et al. | 455/618 |
| 4,443,695 | 4/1984 | Kitamura | 250/205 |
| 4,523,089 | 6/1984 | Maeda et al. | 250/205 |
| 4,580,044 | 4/1986 | Hongo et al. | 372/31 |
| 4,653,058 | 3/1987 | Akiba et al. | 372/50 |
| 4,663,760 | 5/1987 | Shimada et al. | 372/31 |

FOREIGN PATENT DOCUMENTS

| | | |
|---|---|---|
| 061034 | 9/1982 | European Pat. Off. . |
| 082357 | 6/1983 | European Pat. Off. . |
| 56-133714 | 10/1981 | Japan . |
| 60-145680 | of 1985 | Japan . |
| 0169180 | 9/1985 | Japan .................... 372/31 |

OTHER PUBLICATIONS

"Simultaneous Feedback Control of Bias and Modulation Currents for Injection Lasers", Chen, Electronics Letters, 1/3/80, vol. 16, No. 1, pp. 7–8.

*Primary Examiner*—John D. Lee
*Assistant Examiner*—B. R. R. Holloway
*Attorney, Agent, or Firm*—Fitzpatrick, Cella, Harper & Scinto

[57] ABSTRACT

A light quantity control device suitable for use in a laser beam printer. A controller varies the quantity of light emitted by a semiconductor laser so as to maintain a constant light quantity, regulating the rate of variation of the light quantity according to the output of a monitor for detecting the quantity of light emitted from the semiconductor laser.

16 Claims, 13 Drawing Sheets

LASER CURRENT Iℓ

SET LASER CURRENT I_S
SPECIFIED BIAS CURRENT I_{BO}
THRESHOLD CURRENT I_{th}
SET BIAS CURRENT I_{BT}

LIGHT EMISSION CURRENT

BIAS CURRENT

T_O    T_B         T_D      TIME t

FIG. 2B

MONITOR VOLTAGE V_M

LIGHT QUANTITY SETTING VOLTAGE V_D

BIAS CURRENT SPECIFYING VOLTAGE V_{BO}

T_O    T_B         T_D      TIME t
↑
APCST

| REGION A | REGION B |

```
         MSB
XB     = Bn   Bn-1  ------  B3  B2  B1

XB0  = 0      0     ------   0   0   0
XB1  = 0      0     ------   0   0   1
XB2  = 0      0     ------   0   1   0       COUNT UP
XB3  = 0      0     ------   0   1   1
 ⋮
XBn-1 = 1     1     ------   1   1   1
```

FIG. 4B $I_B$ BIAS CURRENT
($I_D$ LIGHT EMISSION CURRENT)

$X_B$ BIAS COUNT
($X_D$ LIGHT EMISSION COUNT)

LIGHT QUANTITY CONTROL DEVICE

BACKGROUND OF THE INVENTION

1. Field of the Invention

The present invention relates to a light quantity control device adapted for use in a beam recording apparatus or the like.

2. Related Background Art

In the field of beam recording apparatus equipped with a light quantity control device there is already known a laser beam printer, in which a photosensitive member is scanned with a laser beam modulated according to input information to form an electrostatic latent image, and the latent image is rendered visible with magnetic developing powder, called toner, and is then transferred onto a recording material such as paper.

Figure 12:
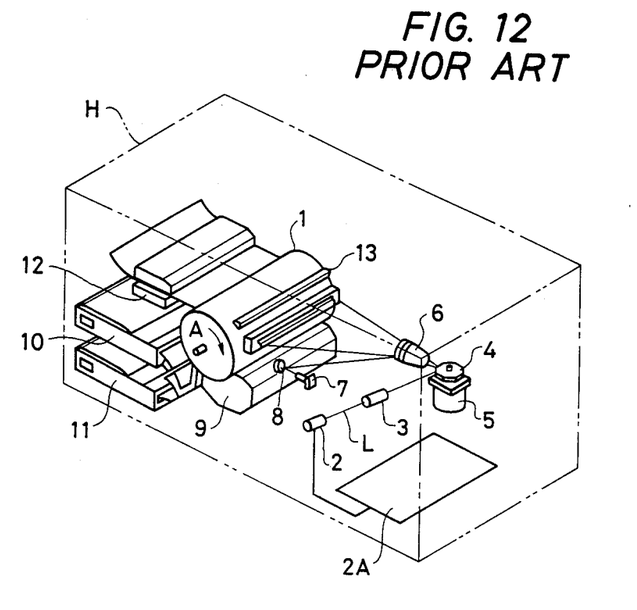
FIG. 12 is a perspective view showing a conventional laser recording apparatus.

FIG. 12 illustrates an example of such a conventional laser beam printer, in which a photosensitive drum 1 having a surface semiconductor layer of selenium or cadmium sulfide is rotatably supported in a housing and rotated at a constant speed in a direction A. There are also provided a semiconductor laser 2 and a control circuit 2A for the intensity and on-off control of the laser beam from the laser 2.

The laser beam L emitted by the semiconductor laser 2 is expanded to a predetermined diameter by a beam expander 3, and then enters a polygon mirror 4 having plural mirror faces and rotated at a fixed speed by a scanner motor 5, whereby the laser beam is deflected by the polygon mirror to perform a scanning motion in the substantially horizontal direction. Then the beam is focused, by an imaging lens 6 of f-$\theta$ characteristic, as a light spot on the photosensitive drum 1 previously charged to a predetermined polarity by a charger 13.

The laser beam reflected by a mirror 8 is detected by a detector 7, whose detection signal determines the timing of modulation of the semiconductor laser 2 for obtaining desired light information on the photosensitive drum 1. On drum 1, an electrostatic latent image is formed by the scanning laser beam, according to the above-mentioned input information. The latent image is rendered visible by toner deposition in a developer unit 9, and the visible image thus obtained is transferred onto a recording material, usually paper, fed from a cassette 10 or 11. The recording material then passes a fixing unit 12 for fixing the image to the material, and is discharged to an unrepresented tray.

Figure 13:
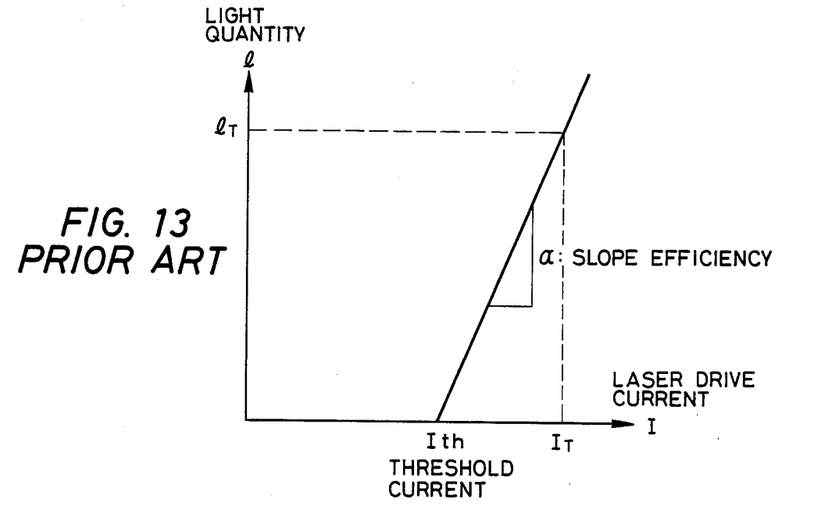
FIG. 13 is a chart showing the relation between the current for driving and quantity of light emitted by a semiconductor laser.

The semiconductor laser usually employed in such a laser beam printer has an I - l characteristic, or the relation of the laser driving current and the emitted quantity of light, as shown in FIG. 13. The semiconductor laser does not emit a beam until the current reaches a threshold value ($I_{th}$), but emits the laser beam when the threshold value is exceeded. In such a beam emission state, the light quantity l shows a certain inclination $\alpha$ as a function of the laser driving current, and $\alpha$ is called slope efficiency.

In such a laser beam printer, the control circuit 2A controls the quantity of light emitted by the semiconductor laser 2 and determines the laser current $I_T$ so as to obtain a predetermined quantity of light $l_T$, and this quantity of light is maintained constant by the supply of a constant laser current $I_T$.

Figure 14:
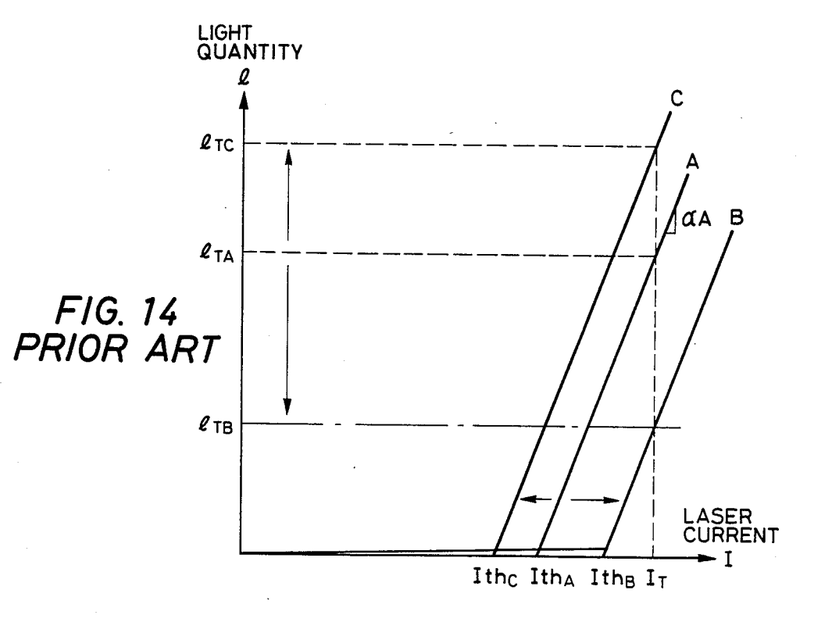
FIG. 14 is a chart showing the relation between quantity of light emitted by and the current for driving a semiconductor laser.

However the I - l characteristic of the semiconductor laser, which has an initial form A as shown in FIG. 14, during a constant current drive with a laser current $I_T$ for obtaining a predetermined light quantity $l_{TA}$, may vary to a form B or C for example due to an increase in the chip temperature caused by the current in the semiconductor laser.

Through a normal operation can be achieved while the photosensitive drum is scanned with the necessary predetermined light quantity $l_{TA}$, the above-explained latent image may not be formed if the I - l characteristic changes to B shown in FIG. 14 due to the increase in temperature so that the light quantity of the laser decreases to $l_{TB}$ despite the maintenance of the laser current at $I_T$. On the other hand the laser chip may be destroyed if the quantity of light increases to $l_{TC}$ as indicated by C. The present applicant already proposed light quantity controlling devices in the U.S. Pat. Nos. 4,201,994 and 4,443,695 but a sufficient effect could not be achieved by the processes disclosed in these patent applications.

SUMMARY OF THE INVENTION

An object of the present invention is to eliminate the above-mentioned drawbacks.

Another object of the present invention is to provide an improvement of the light quantity control device.

Still another object of the present invention is to provide a light quantity control device for enabling image recording of high quality.

Still another object of the present invention is to provide a light quantity control device capable of efficient light quantity control.

Still another object of the present invention is to provide a light quantity control device capable of precise and accurate light quantity control.

Still another object of the present invention is to provide a light quantity control device capable of light quantity control with a simple structure.

Still another object of the present invention is to provide a light quantity control device capable of highly reliable light quantity control.

Still another object of the present invention is to provide a light quantity control device capable of preventing deterioration of an image.

Still another object of the present invention is to provide a light quantity control device capable of light quantity control with high safety.

Still another object of the present invention is to provide a light quantity control device with improved durability.

The foregoing and still other objects of the present invention will become fully apparent from the appended claims and the following description to be taken in conjunction with the attached drawings.

DETAILED DESCRIPTION OF THE PREFERRED EMBODIMENTS

Now the present invention will be clarified in detail by embodiments thereof shown in the attached drawings.

Figure 1:
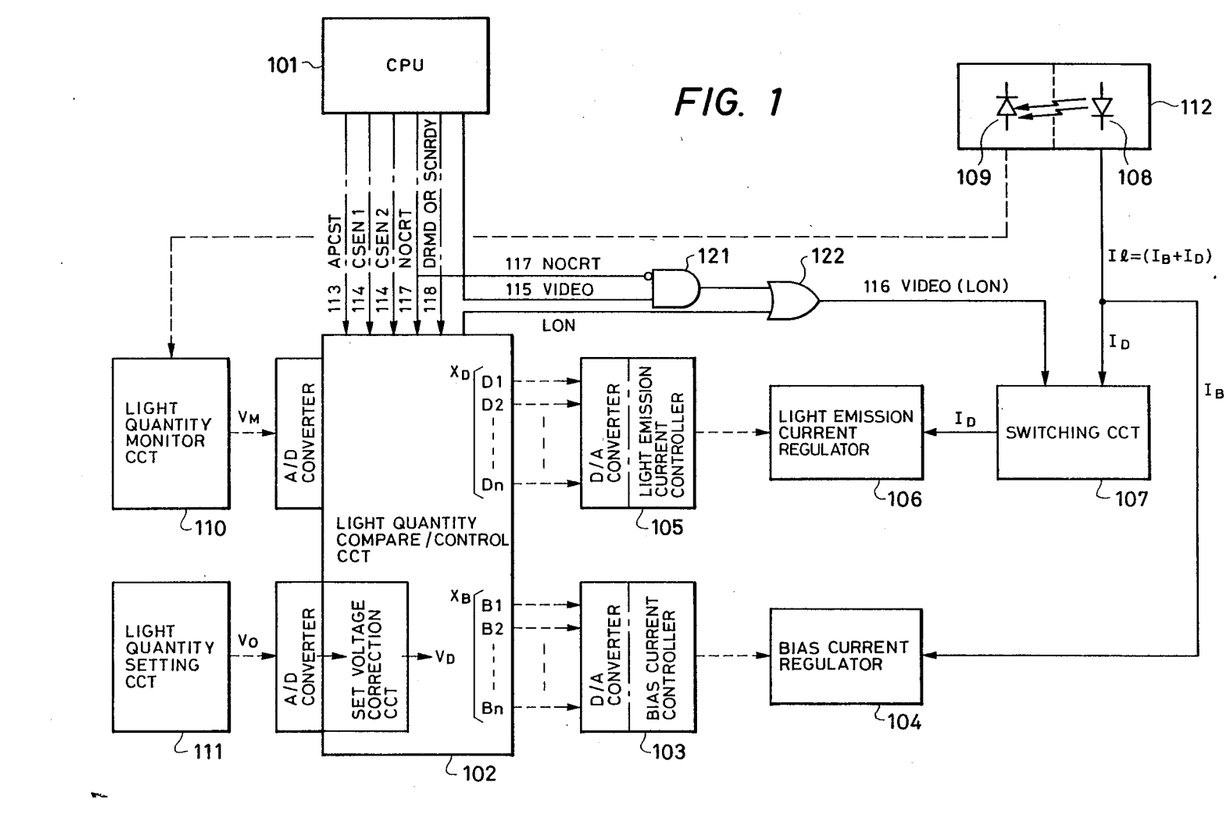
FIG. 1 is a block diagram of a laser drive current control circuit embodying the present invention.

FIG. 1 is a block diagram of the principal part of an embodiment of the present invention.

Figure 2A:
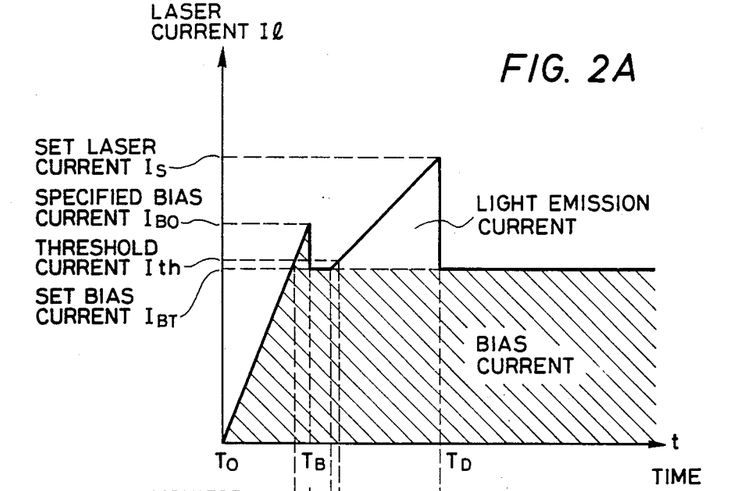
FIGS. 2A and 2B are charts showing the function of the circuit shown in FIG. 1.
Figure 2B:
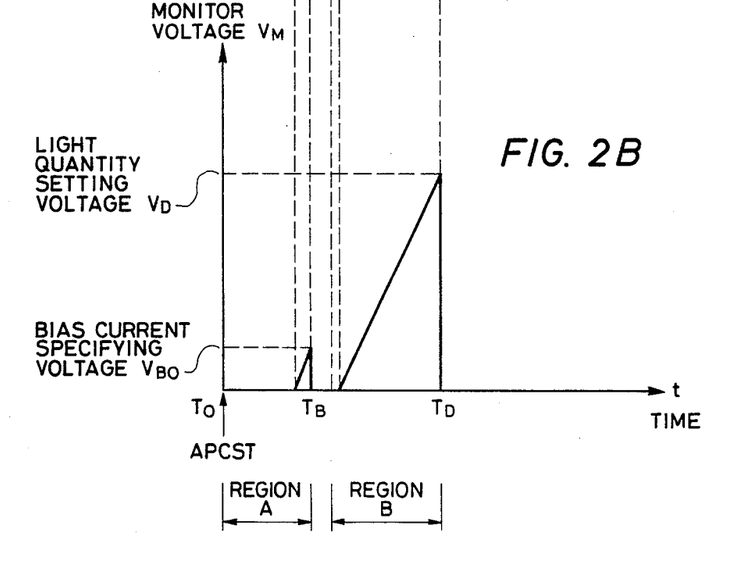
Figure 3:
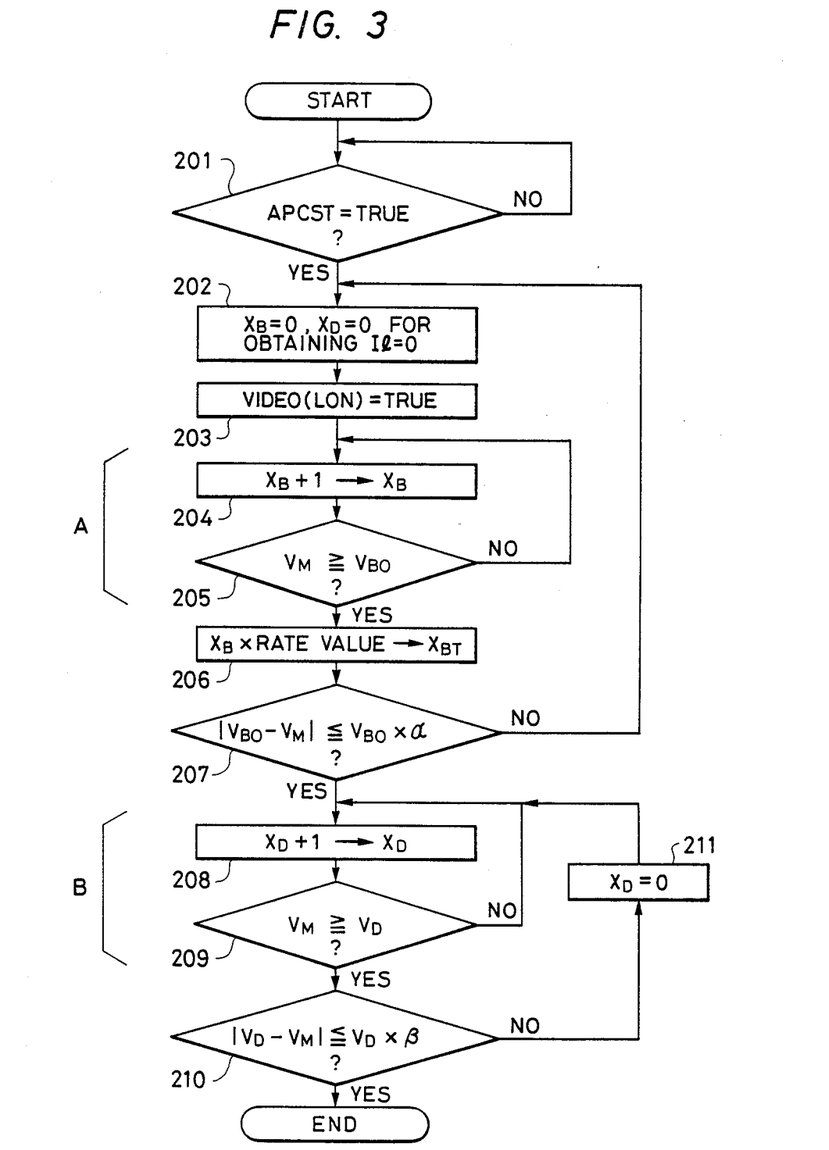
FIG. 3 is a flow chart showing the function of a laser light quantity comparator/controller shown in FIG. 1.

In FIG. 1 there are shown a central processing unit (CPU) 101 for controlling the entire information recording apparatus; a laser light quantity comparator/controller 102 composed of a one-chip microcomputer incorporating an analog-to-digital (A/D) converter for effecting light quantity control as shown in FIG. 2 according to a control sequence as shown in FIG. 3; a bias current control circuit 103 having a digital-to-analog (D/A) converter connected to outputs B1 - Bn of the light quantity comparator/controller 102; a bias current regulator 104 receiving the bias current $I_B$ and controlled by the circuit 103; a light emission current control circuit 105 having a D/A converter connected to other outputs D1 - Dn of the light quantity comparator/controller 102; and a light emission current regulator 106 controlled by the circuit 105 and receiving the light emission current $I_D$ through a light emission current switching circuit 107.

There are further provided a semiconductor laser 108; a photodiode 109 for receiving the light beam from the laser 108; a light quantity monitor circuit 110 for receiving a detection signal from the photodiode 109 and supplying the light quantity comparator/controller with a voltage $V_M$ corresponding to the detected light quantity; a light quantity setting circuit 111 for setting the light quantity of the laser; an AND gate 121; and an OR gate 122.

Now reference is made to a flow chart shown in FIG. 3 for explaining the function of the light quantity comparator/controller 102 explained above.

When an auto light quantity control start signal (APCST) 113 is sent from the central processing unit (CPU) 101 (step 201), the light quantity comparator/controller 102 clears, in a step 202, all the input signals D1 - Dn, B1 - Bn for the D/A converter of the bias current control circuit 103 and the light emission current control circuit 105 thereby sufficiently reducing the laser current $I_l$ (light emission current $I_D$+bias current $I_B$) in the semiconductor laser 108 (for example setting a laser current $I_l$ in the laser unit) through the light emission current regulator 106 and the bias current regulator 104. A next step 203 shifts the video (image) signal LON 116 to a true level, to open the gate of the switching circuit 107, thereby supplying the semiconductor laser 108 with a light emission current.

As explained above, the light emission current control circuit 105 and the bias current control circuit 103 are provided with digital-to-analog converting circuits, such as the D/A converters, and count up or down the digital output signals D1 - Dn and B1 - Bn from the light quantity comparator/controller 102, thereby varying the laser current I in the laser by an analog value corresponding to said up-count or down-count, through the light emission current regulator 106 or the bias current regulator 104.

Figure 4A:
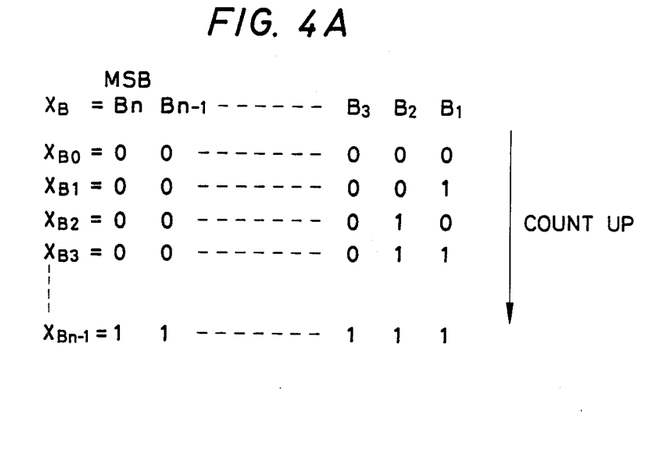
FIGS. 4A and 4B are charts showing the relation between the bias count (or light-emission count) and the bias current (or light-emission current) in an embodiment of the present invention.
Figure 4B:
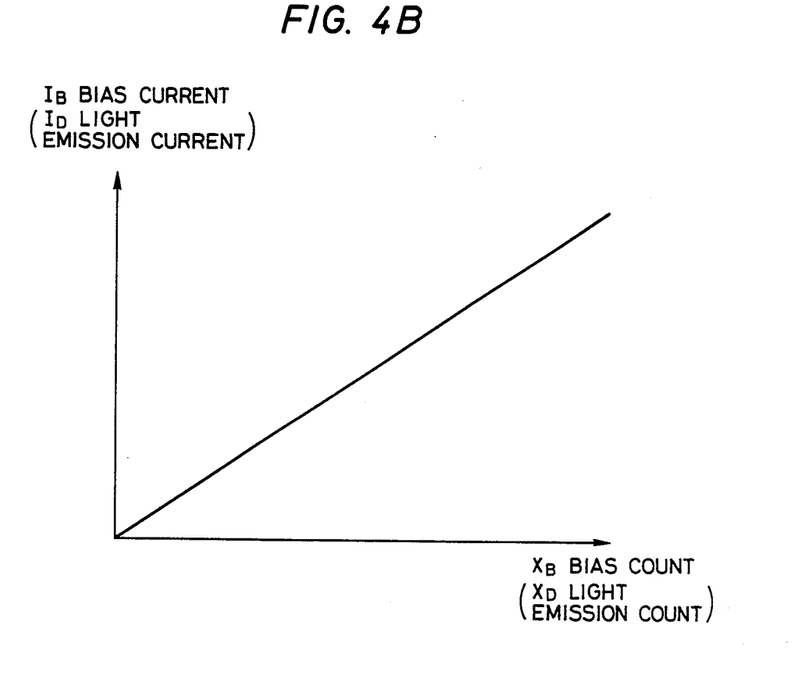

In the present embodiment, the bias count $X_B$ counted by the bias current control circuit 103 is represented by an n-bit binary number having the output B1 of the light quantity comparator/controller 102 as the least significant bit (LSB) and the output Bn as the most significant bit (MSB), and is explained as being counted up or down. FIG. 4A shows a state of counting up the bias count $X_B$, wherein "0" indicates a low or false level, while "1" indicates a high or true level. As shown in FIG. 4B, it is assumed that the bias current $I_B$ increases proportionally with the increase of the bias count $X_B$. A similar relation exists between the light emission count $X_D$ and the light emission current $I_D$.

Figure 5:
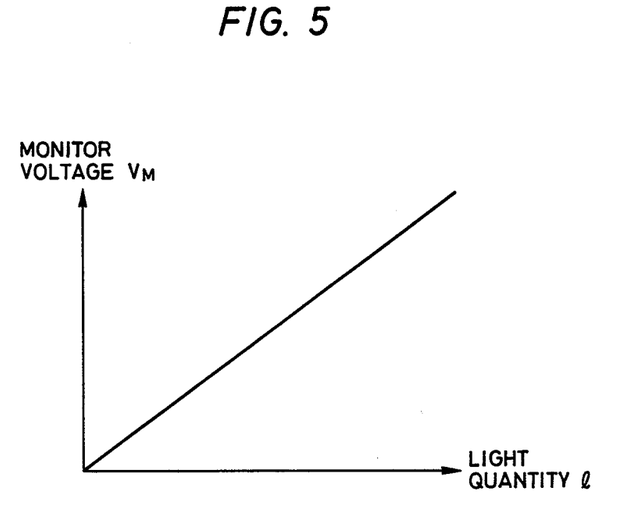
FIG. 5 is a chart showing the relation between the laser light quantity and the monitor voltage in an embodiment of the present invention.

The light emitted by the semiconductor laser 108 is photoelectrically converted by the photodiode 109 in the laser unit 112 and is processed by the light quantity monitor circuit 110 to obtain a monitor voltage $V_M$, as shown in FIG. 5, for feedback to the light quantity comparator/controller 102.

After the bias count $X_B$ and the light emission count $X_D$ are both brought to "0" in the above-explained step 202, a bias current control is conducted in a sequence starting from a step 203.

In such control, as represented by a region A in FIGS. 2A and 2B, the bias current count $X_B$ is counted up stepwise while the light emission count $X_D$ is maintained at "0" (step 204), whereby a laser current corresponding to the thus increasing count $X_B$ is supplied to the semiconductor laser 108 through the bias current regulator 104. The detected value of the light emitted by said laser current is fed back, through the light quantity monitor circuit 110, to the light quantity comaparator/controller 102.

The semiconductor laser 108 emits a beam when the laser current exceeds a threshold current $I_{th}$. Then the bias current count $X_B$ is increased to increase the laser current in the semiconductor laser 108. The up-counting of the bias current count $X_B$ is terminated when the monitor voltage $V_M$ reaches a bias current specifying voltage $V_{BO}$ (step 205).

The bias current count in this state is defined as the bias current specifying count $X_{BO}$. In states $X_B = X_{BO}$, the laser 108 emits a laser beam with an intensity which may be sufficient for forming a latent image on the photosensitive drum 1. Consequently the bias current actually employed is defined by a count $X_{BT}$ obtained by multiplying a constant value (for example 80%) on specifying count $X_{BO}$ (step 206).

The current in the laser 108, corresponding to the bias current setting count $X_{BT}$, is defined as the set bias current $I_{BT}$. The bias voltage $V_M$ is confirmed while the set bias current $I_{BT}$ is supplied to the semiconductor laser 108, and when the absolute value of the difference of the monitor voltage $V_M$ and the bias current specifying voltage $V_{BO}$ exceeds the voltage $V_{BO}$ multiplied by a constant $\alpha$ (step 207), the sequence returns to the step 202, in order to reset the bias current count $X_B$ to "0", thereby terminating the laser current, and repeating the bias current control from the beginning.

When a condition $|V_{BO}-V_M| \leq V_{BO} \times \alpha$ is satisfied, the sequence procees from the steps 207 to 208. In a sequence starting from the step 208, the light emission current is controlled while set bias current $I_{BT}$ is supplied to the semiconductor laser 108. In this state the video signal is shifted to the true level, in order to open the gate in the switch circuit 107, thereby enabling the supply of the light emission current $I_D$ to the semiconductor laser 108.

As represented by the region B in FIGS. 2A and 2B, the control of the light emission current is conducted by maintaining the bias current count $X_B$ which is maintained at the bias current setting count $X_{BT}$ thereby supplying the semiconductor laser 108 with the set bias current $I_{BT}$. The light emission count $X_O$ is increased stepwise from "0" (step 208). A current $I_D$ corresponding to the thus increasing count $X_D$ is added, by the light emission current regulator 108, to the set bias current $I_{BT}$. Consequently the laser current Il is represented by the sum of the set bias current $I_{BT}$ and the light emission current $I_D$, that is, $Il=I_{BT}+I_D$.

The intensity of the laser beam caused by the laser current Il is photoelectrically converted by the photodiode 109 incorporated in the semiconductor laser unit 112 and is fed back, by the light quantity monitor circuit 110, to the light quantity comparator/controller 102. In response to the up-counting of the light emission count $X_D$ by one, the light emission current $I_D$ increases, thereby increasing the intensity of the laser beam.

The increase in the light quantity is detected by the increase in the monitor voltage $V_M$. The light emission count $X_D$ is counted up to increase the current in the laser 108, and the up-counting of the light emission count $X_D$ is terminated when the monitor voltage $V_M$ reaches the light quantity specifying voltage $V_D$ (step 209).

The light emission current count in this state is defined as the light emission current setting count $X_{DT}$. The current in the semiconductor laser 108 in this state, corresponding to the light emission current setting count $X_{DT}$, is defined as the set light emission current $I_{DT}$. The monitor voltage $V_M$ is confirmed while the set light emission current is supplied to the semiconductor laser 108. If the monitor voltage $V_M$ is not within a predetermined range (for example $\pm 5\%$) with respect to the light quantity specifying voltage $V_D$ (step 210), the light emission current count $X_D$ is cleared (step 211) to terminate the light emission current $I_D$, and the sequence returns to the step 208 to repeat the light emission current control.

On the other hand, if the monitor voltage $V_M$ is within the range with respect to the light quantity specifying voltage $V_D$ and the APCST signal from the central processing unit 101 is in the false level, the light emission current setting count $X_{DT}$ and the bias current setting count $X_{BT}$ are retained but the gate of the switching circuit 107 is closed to limit the current in the laser 108 only to the bias setting current $I_{BT}$. Also in case the APCST signal is in the true level, the gate of the switching circuit 107 is maintained open, and is closed when the APCST signal is shifted to the false level.

Figure 6:
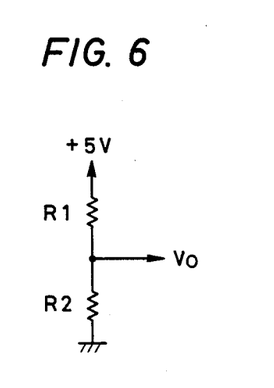
FIG. 6 is a circuit diagram showing an example of the laser light quantity setting circuit shown in FIG. 1.

The light quantity specifying voltage $V_D$ mentioned above is determined in the following manner. At first the light quantity setting voltage $V_O$ is determined by the light quantity setting circuit 111. Voltage $V_O$ may be obtained by a voltage division with resistors as shown in FIG. 6. Voltage $V_O$ supplied to the light quantity comparator/controller 102 is corrected by the sensitivity of the photosensitive drum 1, supplied by signals 114 (CSEN1, CSEN2) from the central processing unit 1. The correcting value for $V_O$ is represented for example as $+10\%$ or $-10\%$ with respect to the central value $V_O$, and the thus corrected value is defined as the light quantity specifying voltage $V_D$.

As shown by the regions A and B in the flow chart in FIG. 3, the bias count $X_B$ and the light emission count $X_D$ are respectively increased by one step until the monitor voltage $V_M$ reaches the bias current specifying voltage $V_{BO}$ or the light quantity specifying voltage $V_D$ (steps 204, 208 in FIG. 3).

Though such up-counting enables precise control of the light quantity, a longer time will be required if a higher precision is intended by an increase in the number of bits of the count $X_B$ or $X_D$. The time available for automatic light quantity control is limited since this operation is usually conducted in the interval between sheet feedings.

Figure 15A:
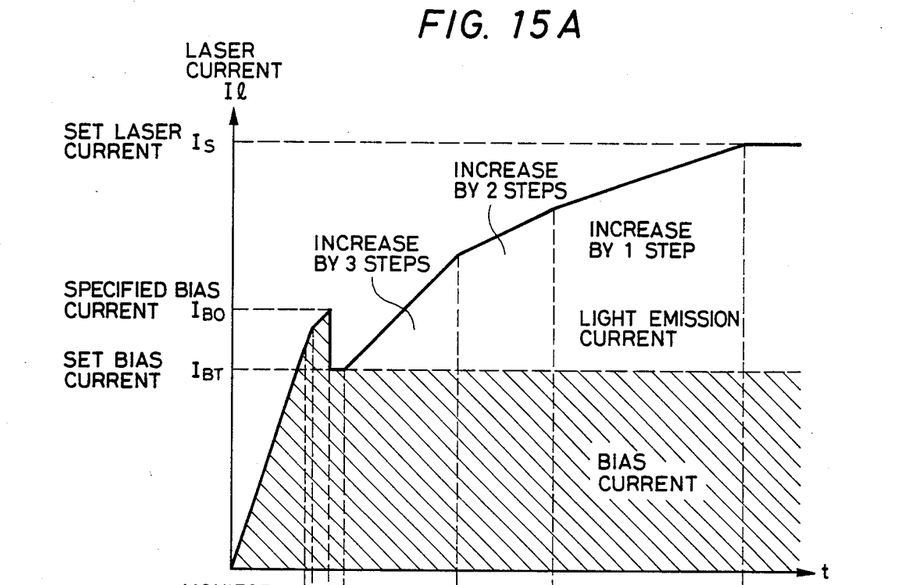
FIGS. 15A and 15B are charts showing the characteristic of the embodiment of the present invention in a high-speed high-precision control operation.
Figure 15B:
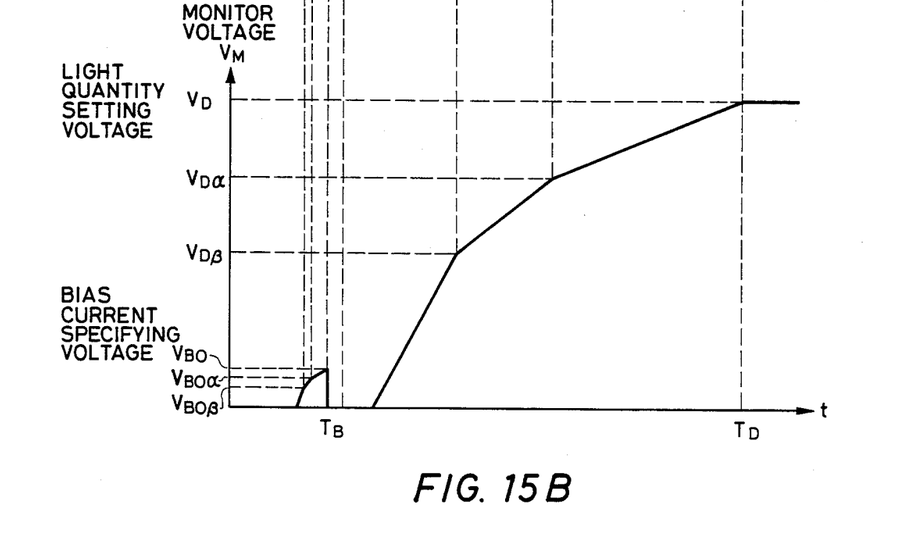
Figure 16:
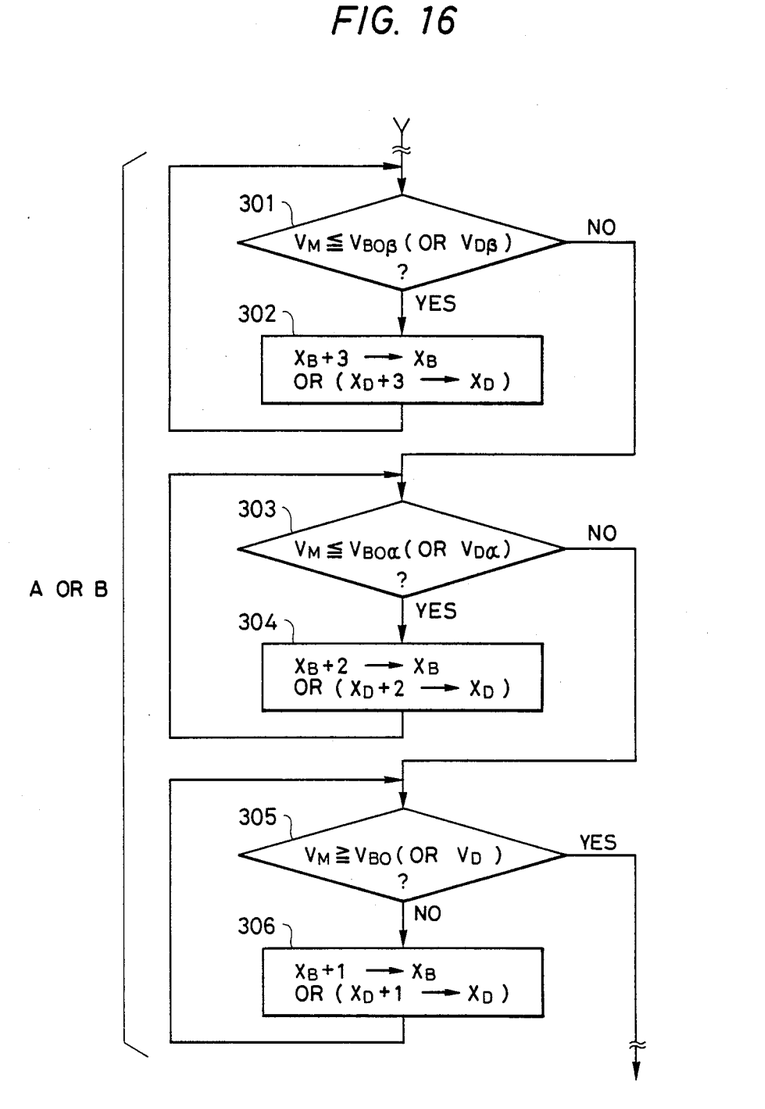
FIG. 16 is a flow chart showing a high-speed high-precision control operation of an embodiment of the present invention.

For this reason the present embodiment employs a high-speed and high-precision light quantity control as shown in FIGS. 15 and 16. This control operation will be explained in the following according to the flow chart shown in FIG. 16. In this operation the sequences of the regions A and B in FIG. 3 are replaced by those in FIG. 16. Thus, after the steps 203 and 207 shown in FIG. 3, there is executed a step 301 shown in FIG. 16 to discriminate whether the monitor voltage $V_M$ has reached a value $V_{BO\beta}$ (or $V_{D\beta}$) representing a predetermined proportion of $B_{BO}$ (or $V_D$), and if $V_M$ is lower than $V_{BO\beta}$ (or $V_{D\beta}$), a next step 302 increases the bias count $X_B$ (or the light emission count $X_D$) by 3 counts at a time.

Then, when the monitor voltage $V_M$ exceeds $V_{BO\beta}$ (or $V_{D\beta}$), a step 303 compares the voltage $V_M$ with another proportion $V_{BO\alpha}$ (or $V_{D\alpha}$) of the voltage $V_{BO}$ (or $V_D$), and, if the monitor voltage $V_M$ is smaller, a step 304 increases the count $X_B$ (or $X_D$) by 2 counts at a time.

Then, when the monitor voltage $V_M$ exceeds $V_{BO\alpha}$ (or $V_{D\alpha}$), a step 305 compares the monitor voltage $V_M$ with the bias specifying voltage $V_{BO}$ (or the light emission specifying voltage $V_D$), and, if the monitor voltage $V_M$ is smaller, the count $X_B$ (or $X_D$) is increased by one count at a time until the monitor voltage $V_M$ reaches $V_{BO}$ (or $V_D$). When $V_M$ reaches $V_{BO}$ (or $V_D$), the sequence proceeds to the step 206 or 210 shown in FIG. 3. The above-explained sequence enables automatic light quantity control of high precision within a short time as shown in FIG. 15. In the foregoing explanation, the parenthesized portions correspond to the region B in FIG. 3.

Figure 7A:
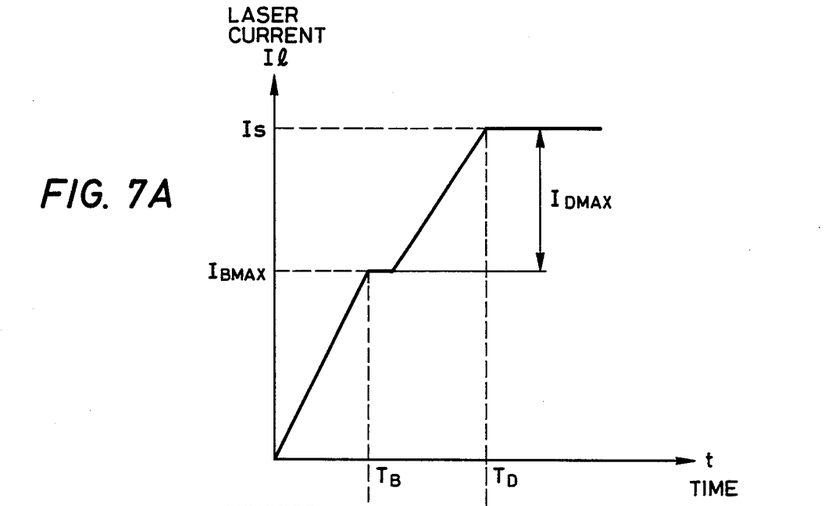
FIGS. 7A and 7B are charts showing the function of the laser light quantity comparator/controller shown in FIG. 1.
Figure 7B:
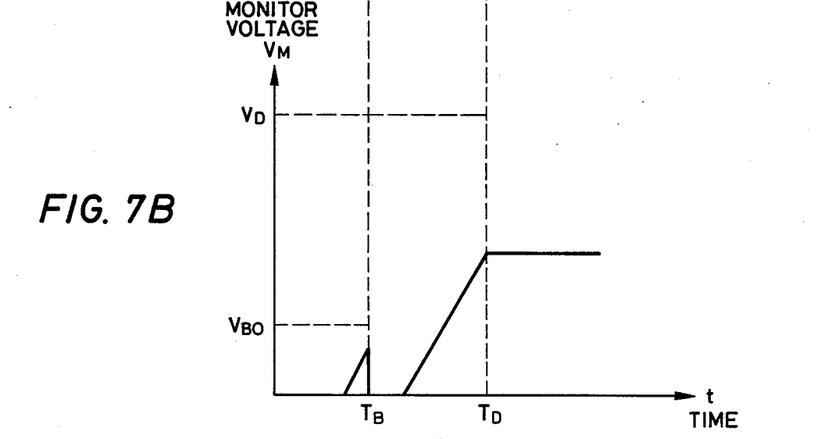

Then, as shown in FIGS. 7A and 7B, the laser current Il is increased by the up-counting of the bias count $X_B$, and, if the monitor voltage $V_M$ does not reach the bias current specifying voltage $V_{BO}$ even at a time $T_B$ where the bias count $X_B$ is the maximum value, the bias current is determined as the current $I_{MBAX}$ at the maximum bias count, or a predetermined proportion of the current $I_{BMAX}$.

The control of the light emission current is conducted under the presence of a predetermined bias current. The laser current is increased by up-counting of the light emission count $X_D$, and, if the monitor voltage $V_M$ does not reach the light quantity specifying voltage $V_D$ at a time $T_D$ when the light emission count $X_D$ reaches maximum, the control of the light emission current is terminated in the presence of a light emission current $I_{DMAX}$ at the maximum light emission count.

Figure 8:
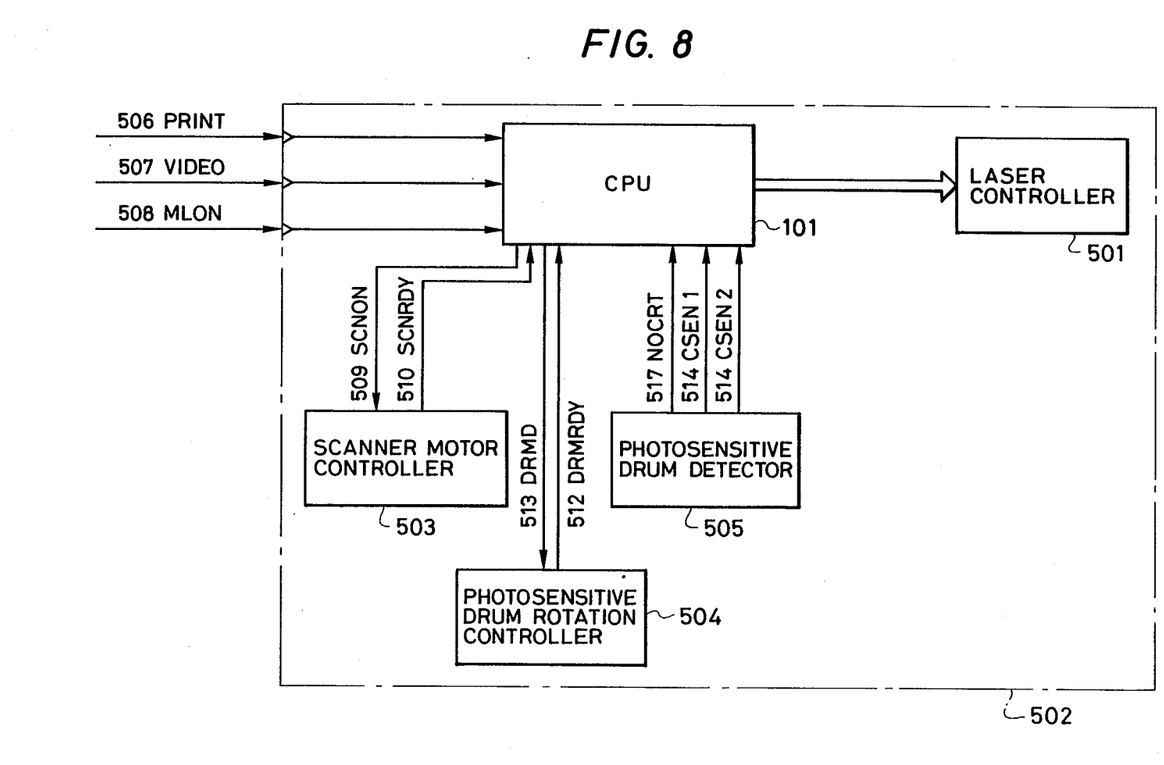
FIG. 8 is a block diagram showing another circuit of the embodiment of the present invention.

FIG. 8 shows the circuit structure other than the laser controller 501 detailedly shown in FIG. 1.

In FIG. 8 there are shown a scanner motor control circuit 503; a photosensitive drum rotation control circuit 504; and a photosensitive drum detecting circuit 505. A central processing unit 101 controls the scanner motor control circuit 503 and the rotation control circuit 504, controlled for example through known integrated circuits for PLL control, and the detecting circuit 505 composed of microswitches or photointerruptors. The CPU 101 also receives a print control signal (PRINT) 506 or a video signal 507 from an operation panel or a reader unit, and a test signal (MLON) 508 from an external control unit, and controls the laser control circuit 501 shown in FIG. 1 in response to these signals.

Figure 9:
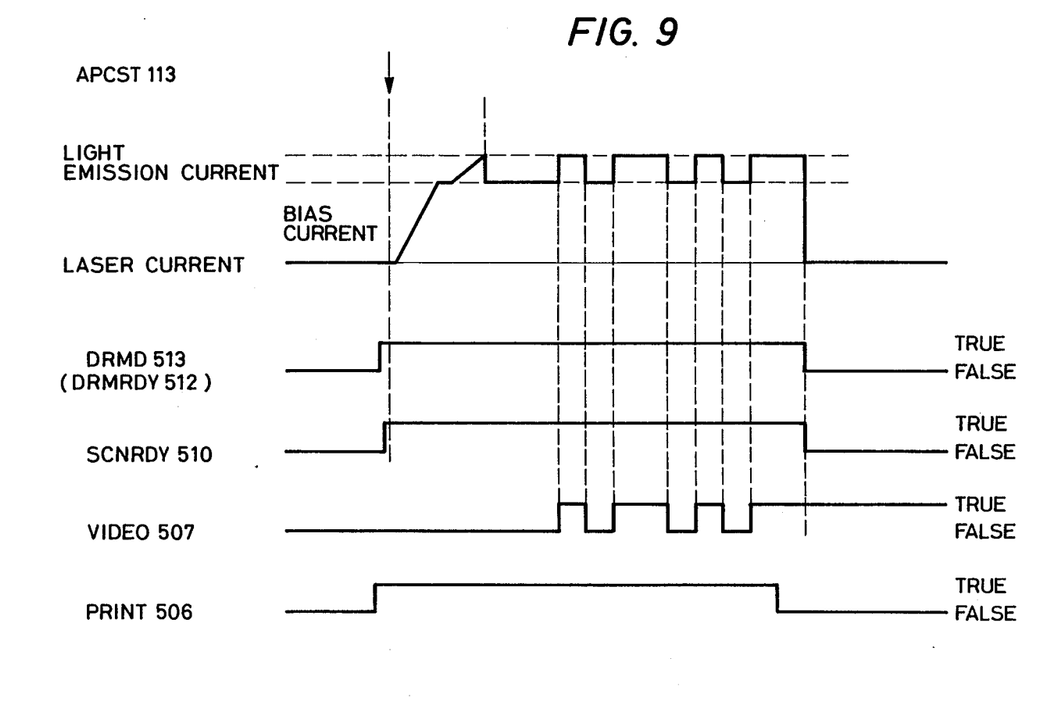
FIG. 9 is a timing chart showing the output of the circuit shown in FIG. 8.
Figure 10:
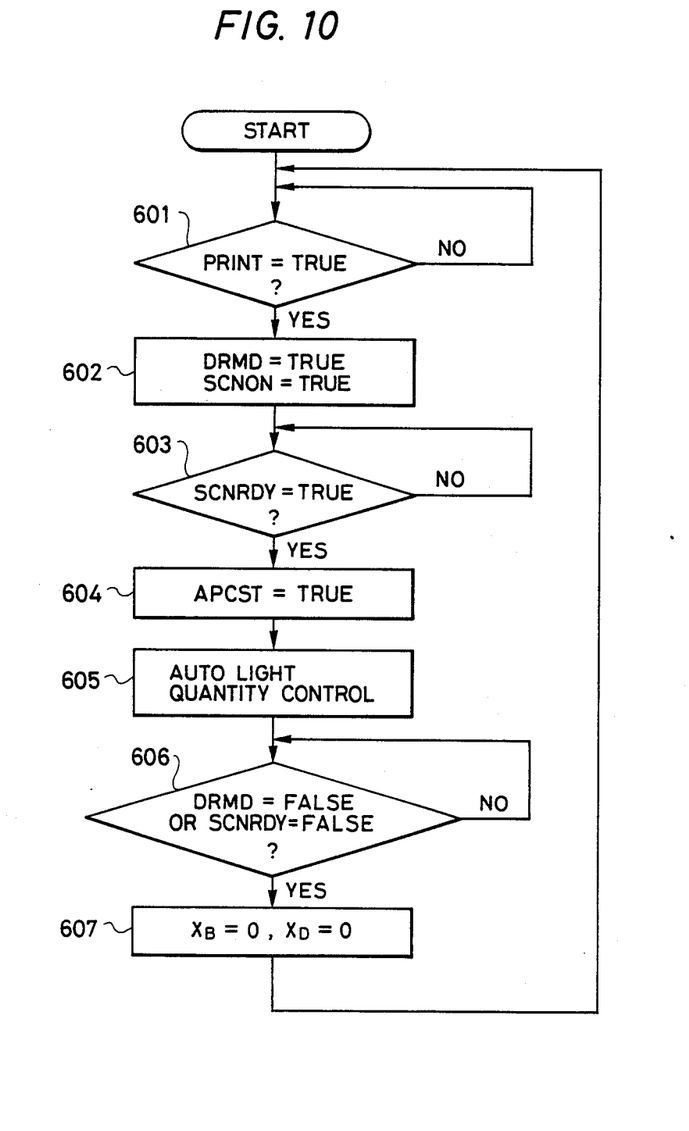
FIG. 10 is a flow chart showing the function of a central processing unit shown in FIG. 8.

Now reference is made to a timing chart shown in FIG. 9 and a flow chart shown in FIG. 10 for explaining the control sequence of the CPU 101.

In response to the entry of the PRINT signal 506 from the external control apparatus in a step 601, a step 602 shifts a drum drive signal (DRMD) 513 and a scanner motor drive signal (SCNON) 509 to the true level. Then a step 603 confirms a SCNRDY signal 510 indicating that the scanner motor is ready, and a step 604 shifts the auto light quantity control start signal (APCST) 113 to the true level.

In response, in a step 605, the light quantity comparator/controller 102 of the laser controller 501 effects the automatic light quantity control of the semiconductor laser 108. Then, when the drum drive signal (DRMD) 513 or the scanner motor rotation ready signal (SCNRY) 510 is shifted to the false state in a step 606, a next step 607 clears the bias count $X_B$ and the light emission count $X_D$ through the light quantity comparator/controller 102, thereby sufficiently reducing the current in the semiconductor laser 108.

The operation of the step 607 may be executed when the drum drive signal (DRMD) 513 is shifted to the false level, or within a certain period before or after such shifting to the flase level.

Figure 11:
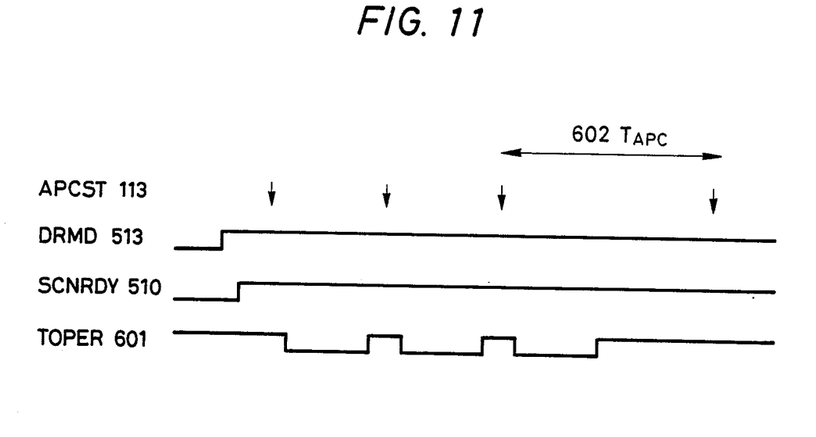
FIG. 11 is a timing chart showing the output signal of the circuit shown in FIG. 8.

Also the APCST signal 113 assumes the true level, in case of a continuous printing operation, between successive printing operations, i.e. in the non-image area between successive recording sheets as shown in FIG. 11, and the automatic light quantity control is completed within said non-image area. Also if the APCST signal 113 is not generated over a predetermined period $T_{APC}$, the automatic light quantity control is conducted after period $T_{APC}$. A TOPER signal 601 shown in FIG. 11 indicates the above mentioned non-image area.

The present invention is not limited to the foregoing embodiments but is subject to various modifications within the scope and spirit of the appended claims.

We claim:

1. A light quantity control device comprising:
   beam generating means;
   monitor means for monitoring the quantity of light of a beam generated by said beam generating means; and
   control means for controlling the light quantity of the beam generated by said beam generating means in response to the output of said monitor means, wherein said control means comprises digital value output means for outputting a digital value representing a quantity of light of the beam and a light quantity control circuit means for controlling the quantity of light in response to receiving the digital value, said digital value output means being constructed for varying the rate of change of the digital value in accordance with the output of said monitor means so as to cause the quantity of light to be constant.

2. A light quantity control device according to claim 1, wherein said monitor means detects the quantity of light of said beam as a monitor voltage.

3. A light quantity control device according to claim 1, wherein said digital value output means comprises counter means for counting the digital value and wherein said light quantity control circuit means comprises:
   digital-to-analog converter means for effecting digital-to-analog conversion of a digital count value supplied from said counter means; and
   drive current control circuit means for controlling the drive current for said beam generating means in response to receiving the output of said digital-to-analog converter means.

4. A light quantity control device according to claim 1, wherein said beam generating means comprises a semiconductor laser.

5. A light quantity control device according to claim 1, wherein said digital value output means comprises microcomputer means for effecting a counting operation for counting the digital value in accordance with a predetermined program, and for effecting the counting operation at first count intervals when the output of said monitor means is in a first range, and for effecting the counting operation at second count intervals when the output of said monitor means is in a second range.

6. A light quantity control device according to claim 1, further comprising a photosensitive member employed to record thereon by a beam generated from said beam generating means, wherein said control means includes setting means for setting the amount of the beam generated from said beam generating means, said setting means outputting a set value according to the characteristics of said photosensitive member.

7. A light quantity control device comprising:
   beam generating means for generating a beam for data recording;
   monitor means for monitoring the quantity of light of the beam generated by said beam generating means; and
   control means for controlling the quantity of light of the beam generated by said beam generating means in response to receiving the output from said monitor means, wherein said control means comprises:
   supplying means for supplying a driving current to said beam generating means, the driving current comprising a bias current component and a light emission current component;

first discrimination means for discriminating whether the output of said monitor means reaches a first predetermined level when the bias current component is supplied to said beam generating means; and first hold means for holding a first predetermined value relating to the bias current to effect beam recording when said first discrimination means discriminates that the output of said monitor means reaches the first predetermined level.

8. A light quantity control device according to claim 7, wherein said monitor means detects the quantity of light of said beam as a monitor voltage.

9. A light quantity control device according to claim 7, wherein said control means comprises further:

second discrimination means for discriminating whether the output of said monitor means reaches a second predetermined level when the light emission current component is supplied to said beam generating means; and second hold means for holding a value of the light emission current to effect beam recording when said second discrimination means discriminates that the output of said monitor means reaches the second predetermined level, and wherein said second hold means holds the light emission current value after said first hold means has held the first predetermined value relating to the bias current.

10. A light quantity control device according to claim 9, wherein said first and second hold means hold a bias current value as a first digital value for beam recording and a light emission current value as a second digital value for beam recording, respectively.

11. A light quantity control device according to claim 7, further comprising a photosensitive member employed to record thereon by a beam generated from said beam generating means, wherein said control means includes setting means for setting the amount of the beam generated from said beam generating means, said setting means outputting a set value according to the characteristics of said photosensitive member.

12. A light quantity control device comprising:

beam generating means for generating a beam for data recording;

monitor means for monitoring the quantity of light of the beam generated by said beam generating means;

control means for controlling the quantity of light of the beam generated by said beam generating means in response to receiving the output from said monitor means, wherein said control means comprises:

first and second digital value output means for outputting first and second digital values representing a quantity of light of the beam, respectively;

first and second digital-to-analog converting means for effecting digital-to-analog conversion of the first and second digital values, respectively; and supplying means for supplying a drive current to said beam generating means in response to receiving the outputs of said first and second digital-to-analog converting means.

13. A light quantity control device according to claim 12, wherein the drive current comprises a bias current component and a light emission current component, and wherein said supplying means supplies the bias current to said beam generating means in response to receiving an output of said first digital-to-analog converting means and supplies the light emission current to said beam generating means in response to receiving the output of said digital-to-analog converting means.

14. A light quantity control device according to claim 12, wherein said first and second digital value output means comprise the same microcomputer means for effecting a counting operation of the first and second digital values in accordance with a predetermined program, and for effecting the counting operation at first count intervals when the output of said monitor means is in a first range, and for effecting the counting operation at second count intervals when the output of said monitor means is in a second range.

15. A light quantity control device according to claim 12, said first and second digital value output means being arranged for varying the rate of change of the digital value in accordance with the output of said monitor means so as to cause the quantity of light of the beam to be constant.

16. A light quantity control device according to claim 12, further comprising a photosensitive member employed to record thereon by a beam generated from said beam generating means, wherein said control means includes setting means for setting the amount of the beam generated from said beam generating means, said setting means outputting a set value according to the characteristics of said photosensitive member.

* * * * *

UNITED STATES PATENT AND TRADEMARK OFFICE
CERTIFICATE OF CORRECTION

PATENT NO. : 4,890,288

DATED : December 26, 1989

INVENTOR(S) : TOSHIHIKO INUYAMA, ET AL.

It is certified that error appears in the above-identified patent and that said Letters Patent is hereby corrected as shown below:

COLUMN 10

Line 23, "digital-to-analog converting means." should read --second digital-to-analog converting means.--.

Signed and Sealed this

Eleventh Day of June, 1991

*Attest:*

HARRY F. MANBECK, JR.

*Attesting Officer*   *Commissioner of Patents and Trademarks*